(12) United States Patent
En Gad et al.

(10) Patent No.: US 11,394,403 B1
(45) Date of Patent: Jul. 19, 2022

(54) ERROR CORRECTION BASED ON RATE ADAPTIVE LOW DENSITY PARITY CHECK (LDPC) CODES WITH FLEXIBLE COLUMN WEIGHTS IN THE PARITY CHECK MATRICES

(71) Applicant: Micron Technology, Inc., Boise, ID (US)

(72) Inventors: Eyal En Gad, Highland, CA (US); Sivagnanam Parthasarathy, Carlsbad, CA (US); Zhengang Chen, San Jose, CA (US); Mustafa N. Kaynak, San Diego, CA (US); Yoav Weinberg, Thornhill (CA)

(73) Assignee: MICRON TECHNOLOGY, INC., Boise, ID (US)

(*) Notice: Subject to any disclaimer, the term of this patent is extended or adjusted under 35 U.S.C. 154(b) by 0 days.

(21) Appl. No.: 17/409,359

(22) Filed: Aug. 23, 2021

(51) Int. Cl.
| | |
|---|---|
| H03M 13/35 | (2006.01) |
| H03M 13/11 | (2006.01) |
| H03M 13/00 | (2006.01) |
| G06F 11/10 | (2006.01) |
| H03M 13/29 | (2006.01) |

(52) U.S. Cl.
CPC ....... *H03M 13/353* (2013.01); *G06F 11/1076* (2013.01); *H03M 13/1102* (2013.01); *H03M 13/2906* (2013.01); *H03M 13/616* (2013.01)

(58) Field of Classification Search
None
See application file for complete search history.

(56) References Cited

U.S. PATENT DOCUMENTS

| | | | | |
|---|---|---|---|---|
| 7,093,179 B2 * | 8/2006 | Shea | ................. | H03M 13/2975 714/755 |
| 10,530,392 B2 * | 1/2020 | Reynwar | ........... | H03M 13/6577 |

OTHER PUBLICATIONS

Chen et al., "Rate-Adaptive Protograph LDPC Codes for Multi-Level-Cell NAND Flash Memory", IEEE Communications Letters, vol. 22, No. 6, Jun. 2018, 4 pages.
Hu et al., "Progressive Edge-Growth Tanner Graphs", In IEEE, 2021, 7 pages.
Lee et al., "Work-in-Progress: ECC Management with Rate Compatible LDPC Code for NAND Flash Storage", IEEE, 2020, 2 pages.

(Continued)

*Primary Examiner* — Phung M Chung
(74) *Attorney, Agent, or Firm* — Nicholson De Vos Webster & Elliott LLP

(57) ABSTRACT

Methods and system for error correction based on rate adaptive LDPC codes with flexible column weights in the parity check matrices are described. Data is encoded according to a first encoding parity check matrix of a first Low Density Parity Check (LDPC) code to obtain a first codeword with first parities. The first codeword is encoded according to a second encoding parity check matrix of a second LDPC code to obtain second parities. The first codeword is received. Responsive to failure of error correction of the first codeword based on the first parities, the second parities are received. The first codeword is corrected based on the second parities and a decoding parity check matrix of a rate adaptive LDPC code that is constructed by vertically concatenating the second encoding parity check matrix and the first encoding parity check matrix and adding an all-zero sub-matrix to complete its dimensions.

18 Claims, 7 Drawing Sheets

(56) References Cited

OTHER PUBLICATIONS

Mackay et al., "Comparison of Constructions of Irregular Gallager Codes", IEEE Transactions on Communications, vol. 47, No. 10, Oct. 1999, 6 pages.
Richardson et al., "Efficient Encoding of Low-Density Parity-Check Codes", IEEE Transactions on Information Theory, vol. 47, No. 2, Feb. 2001, 20 pages.
Ryan et al., "Channel Codes", Cambridge University Press, 710 pages.
Zhang et al., "BeLDPC: Bit Errors Aware Adaptive Rate LDPC Codes for 3D TLC NAND Flash Memory", in IEEE, 2021, 4 pages.

\* cited by examiner

FIG. 2A

Parity Check Matrices of a Series of Rate Adaptive Codes 200

202A  $H'_1 = \begin{bmatrix} H_{1,p} & H_{1,u} \end{bmatrix}$
        $\uparrow H_1$ 202B  $H'_2 = \begin{bmatrix} 0 & H_{1,p} & H_{1,u} \\ H_{2,p} & H_{2,u} \end{bmatrix}$
        $\uparrow H_2$ 202C  $H'_3 = \begin{bmatrix} 0 & 0 & H_{1,p} & H_{1,u} \\ 0 & H_{2,p} & H_{2,u} \\ H_{3,p} & H_{3,u} \end{bmatrix}$
        $\uparrow H_3$

US 11,394,403 B1

ERROR CORRECTION BASED ON RATE ADAPTIVE LOW DENSITY PARITY CHECK (LDPC) CODES WITH FLEXIBLE COLUMN WEIGHTS IN THE PARITY CHECK MATRICES

TECHNICAL FIELD

The present disclosure generally relates to error correction in memory devices, and more specifically, relates to rate adaptive LDPC codes with flexible column weights in the parity check matrices.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 2A illustrates an example parity check matrix of a rate adaptive LDPC code, in accordance with some embodiments of the present disclosure.

DETAILED DESCRIPTION

Figure 1:
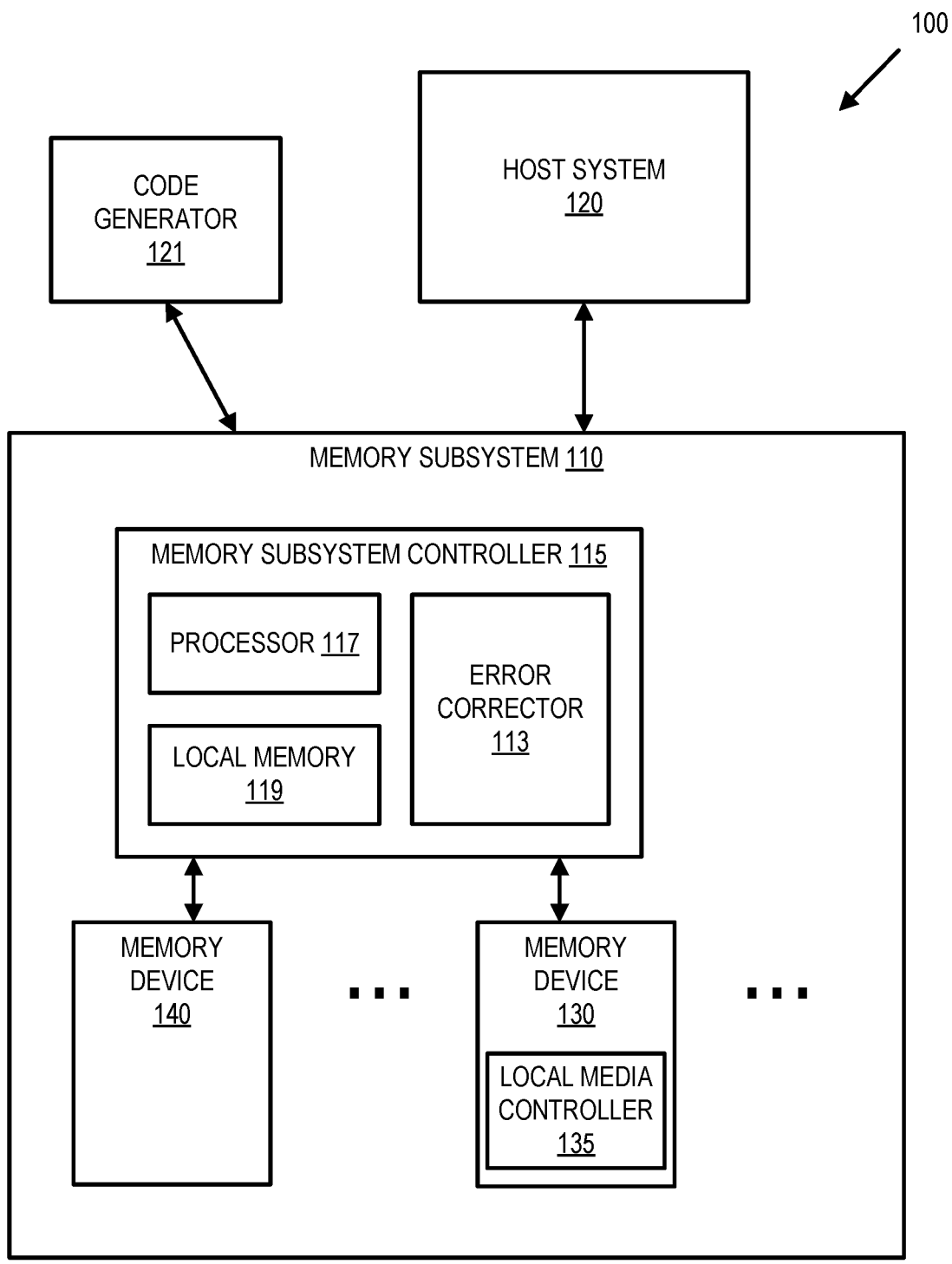
FIG. 1 illustrates an example computing system that includes a memory subsystem in accordance with some embodiments of the present disclosure.

Aspects of the present disclosure are directed to error correction based on rate adaptive LDPC codes with flexible column weights in the parity check matrix in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

Low-Density Parity Check (LDPC) codes are commonly used for enabling error correction in memory subsystems. LDPC codes are a class of highly efficient linear block codes that include single parity check (SPC) codes. LDPC codes have a high error correction capability and can provide performance close to Shannon channel capacity. LDPC generates a codeword including parity data from source data using a parity check matrix (H). A codeword c is in a code C if and only if the matrix-vector product $Hc^T=0$. In LDPC codes, the parity-check matrix H is an M×N matrix that has a low density of is (i.e., most of the elements of the matrix are zero and the matrix contains a small amount of a non-zero element, 1). N is the length of a codeword of the code and M is the number of parity bits. Each matrix row introduces one parity check constraint on an input data vector. The parity check matrix can be represented by a Tanner graph, which is a graphical representation of associations between code bits and parity checks. Each row of the parity check matrix H corresponds to a check node, while each column of H corresponds to a variable node in the graph. An edge on the Tanner Graph connects a check node i with a variable node j only if the corresponding element (row i, column j) in the matrix H is a 1.

A rate-adaptive LDPC code, e.g., $C'_N$, is a type of LDPC code where the encoding of data (e.g., a message) is performed sequentially according to a set of N linear block codes $C_1; C_2; \ldots ; C_N$. The dimension of the rate adaptive code $C'_N$ is equal to the dimension of the linear code $C_1$, while the block-length of the rate adaptive code $C'_N$ is equal to the block length of $C_N$. In one example, when N=2, the message is first encoded according to an initial linear code $C_1$, generating a codeword c1. The codeword c1 includes initial parities p1. The codeword c1 is then encoded according to a subsequent linear code $C_2$, generating a subsequent codeword c2 that includes additional parities p2. The decoding of the encoded message is performed by decoding c1 (which can be a corrupted version including one or more bits in error) to attempt to obtain the original data. In case of decoding failure of the data based on c1, the decoding continues by retrieving the additional parities p2 from the storage subsystem and decoding the rate-adaptive code $C'_2$.

Similarly, when the rate adaptive code is used in a communication environment (e.g., transfer of messages between two network devices), the codeword c1 is transmitted first, and the parities p2 are transmitted only if the decoding of the data based on c1 fails.

Some error correction schemes used in memory subsystems use rate-adaptive LDPC codes. However, these error correction schemes are limited to the use of parity-check matrices that contain columns of weight 1 (i.e., the sum of all elements of a column of the matrix is 1), which significantly degrades their decoding correction capability.

Aspects of the present disclosure address the above and other deficiencies by presenting an error correction scheme that is based on rate-adaptive LDPC codes with flexible column weight in the parity check matrix allow for strong correction capabilities. Allowing greater column-weight flexibility enables strong correction capability while taking advantage of the benefits of rate adaptive LDPC codes. Rate-adaptive codes allow additional parities to be stored in a separate section of a memory device (e.g., another page), providing protection for cases where the number of errors is high and there is a need for the additional parities.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The system 100 includes a code generator 121 that can generate rate adaptive LDPC codes with flexible column weights in parity check matrices. For example, code (parity-check matrices) can be generated prior to the manufacturing of memory subsystem 110 using a scientific program/platform, such as MATLAB. In some embodiments, the code generator 121 is included in the host system 120. In other embodiments, the code generator 121 is included in another electronic device that is communicatively coupled with the system 100 for transferring the rate adaptive LDPC codes once they are generated. The code generator 121 can be operative to transmit the parity check matrices of a series of LDPC codes and parity check matrices of a series of rate adaptive LDPC codes to the error corrector 113 that will use them for encoding and error correcting data.

The memory subsystem 110 includes an error corrector 113 that can perform error correction based on a rate adaptive LDPC code with flexible column weights in the parity check matrix. In some embodiments, the controller 115 includes at least a portion of the error corrector 113. For example, the controller 115 can include a processor 117 (processing device) configured to execute instructions stored in local memory 119 for performing the operations described herein. In some embodiments, an error corrector 113 is part of the host system 110, an application, or an operating system.

In some embodiments, the error corrector 113 is operative to encode and decode data stored in the memory device (e.g., an encoder and/or decoder) according to a rate adaptive LDPC code. For example, parity-check matrices from the code generator 121 are stored in the error-correcting module 113. Encoding data using an error correcting code (ECC) allows for correction of erroneous data bits when the data is retrieved from the memory device. For example, the error corrector 113 can encode data received from the host system 120 and store the data and parity bits in the memory device 130. The error corrector 113 can further be operative to decode data stored in the memory device 130 to identify and correct erroneous bits of the data before transmitting corrected data to the host system 120. Although illustrated as a single component that can perform encoding and decoding of data, the error corrector 113 can be provided as separate components. In some embodiments, the error corrector 113 is operative to encode data according to a rate adaptive LDPC code with flexible column weights in the parity check matrix. The error corrector 113 is operative to encode data according to the LDPC code into one or more codewords that are stored in the memory device 130. The error corrector 113 is also operative to decode a codeword based on the rate adaptive LDPC code. While the embodiments herein will be described with respect to memory subsystems, other embodiments can use the proposed error correction schemes in a communication system (e.g., for transferring of data between two network devices).

Figure 2B:
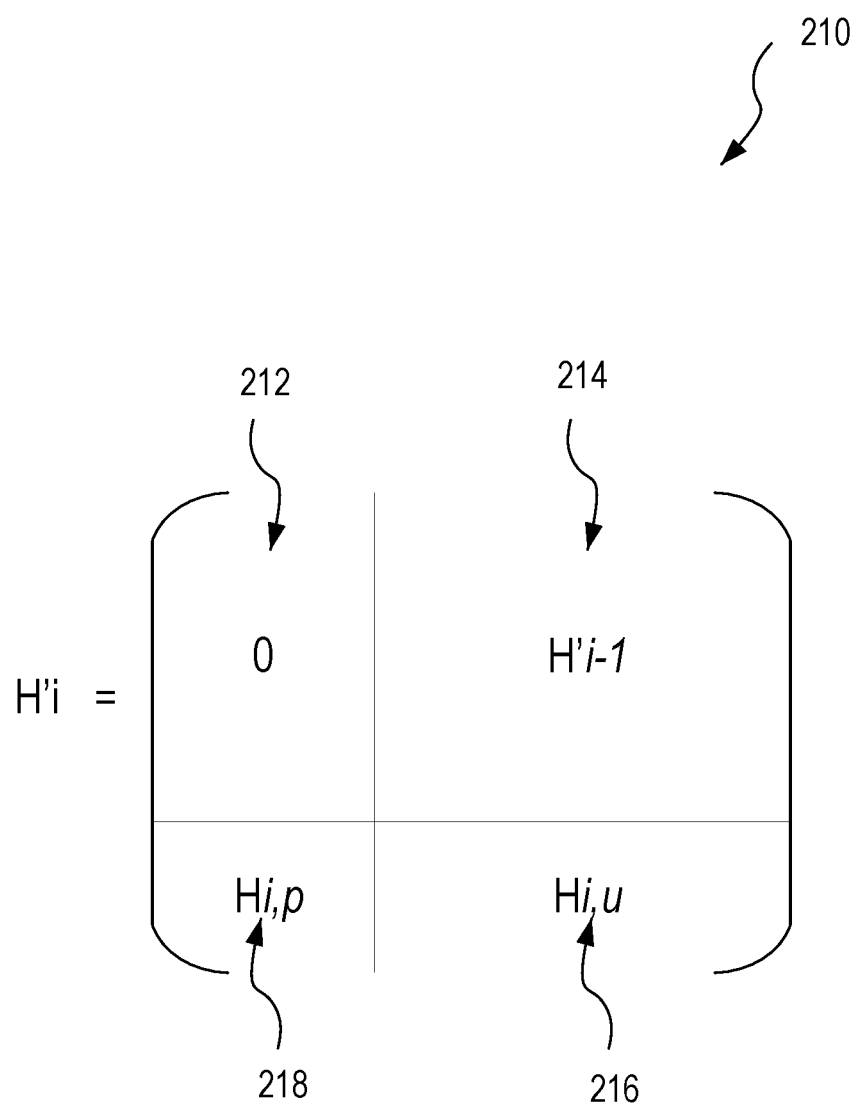
FIG. 2B illustrates an exemplary parity check matrices of a series of rate adaptive LDPC codes, in accordance with some embodiments of the present disclosure.

In one embodiment, the error corrector 113 receives data to be encoded. The error corrector 113 encodes the data according to a parity check matrix of an initial LDPC code of a set of LDPC codes to obtain an initial codeword with initial parities. The error corrector 113 encodes the codeword according to a subsequent a parity check matrix of a subsequent LDPC code of the set of LDPC codes to obtain subsequent parities for the codeword. The codeword and the subsequent parities are stored in a memory device, e.g., memory device 130. The codeword is stored in a location that is more accessible than the location of the subsequent parities. The subsequent parities can be stored in a cheaper and less accessible location of the storage subsystem. The error corrector 113 receives the codeword including the initial parities and attempts to correct the codeword based on these parities. Responsive to failure of error correction of the codeword based on the initial parities, the error corrector 113 receives additional parities and attempts to correct errors in the codeword based on these additional parities. The error corrector 113 error corrects of the codeword based on the additional based on a parity check matrix of a rate adaptive LDPC code. The parity check matrix is constructed by vertically concatenating the subsequent parity check matrix and the initial parity check matrix and adding an all-zero sub-matrix to complete the dimensions of the parity check matrix. FIGS. 2A-B provide an example of a parity check matrix of a rate adaptive LDPC code that can be used in some implementations.

FIG. 2A illustrates an exemplary parity check matrices 202A-C of a series of rate adaptive LDPC codes 200, in accordance with some embodiments of the present disclosure. The illustrated example includes three codes from a series of rate adaptive codes. Each code is associated with a decoding parity check matrix $H'_1$, $H'_2$, and $H'_3$, respectively. The series of rate adaptive codes are constructed based on LDPC codes with encoding parity check matrices $H_1$, $H_2$, and $H_3$. The decoding parity check matrix $H'_1$ of the initial rate adaptive code is the parity check matrix of the initial LDPC code $H'_1$. In some embodiments, the encoding matrix $H_1$ is a systematic matrix that includes a sub-matrix $H_{1,p}$ for determining parities and a sub-matrix $H_{1,u}$ for the data to be encoded. In some embodiments, the sub-matrix $H_{1,u}$ is an identify matrix. The decoding parity check matrix $H'_2$ of the subsequent rate adaptive code includes a vertical concatenation of the encoding parity check matrix $H_2$ of the subsequent LDPC code and the initial decoding parity check matrix of the rate adaptive LDPC code $H'_1$, which in this case is the encoding parity check matrix of the LDPC code $H_1$. The decoding parity check matrix $H'_2$ further includes an all-zero sub-matrix to complete its dimensions. The decoding parity check matrix $H'_3$ of the subsequent rate adaptive code includes a vertical concatenation of the encoding parity check matrix $H_3$ of the subsequent LDPC code and the decoding parity check matrix $H'_2$ of the preceding rate adaptive LDPC code, which includes the vertical concatenation of $H_2$ and $H'_1$. The decoding parity check matrix $H'_3$ further includes an all-zero sub-matrix to complete its dimensions. While this example includes three parity check matrices for three codes, this should not be considered a limitation, and a series of rate adaptive codes can include more or less elements.

FIG. 2B illustrates an example parity check matrix 210 of a rate adaptive LDPC code, in accordance with some embodiments of the present disclosure. In some embodiments, a series rate adaptive codes includes N codes associated with N parity check matrices. The series of rate adaptive LDPC codes is associated with a series of N LDPC codes with encoding parity check matrices $H_1$ to $H_N$. A decoding matrix $H'_1$ 210 of a code i from the series of rate adaptive codes includes a vertical concatenation of a decoding matrix $H'_{i-1}$ 214 of a rate adaptive LDPC code, which precedes the code i in the series of codes, and the encoding matrix $H_i$ of a code i from the series of LDPC codes. In some embodiments, the encoding matrix $H_i$ is a systematic matrix that includes a sub-matrix $H_{i,p}$ 218 for determining parities and a sub-matrix $H_{i,u}$ 216 for the data to be encoded. In some embodiments, the sub-matrix $H_{i,u}$ is an identify matrix. The matrix $H'_i$ 210 further includes an all-zero submatrix 212.

Figure 3:
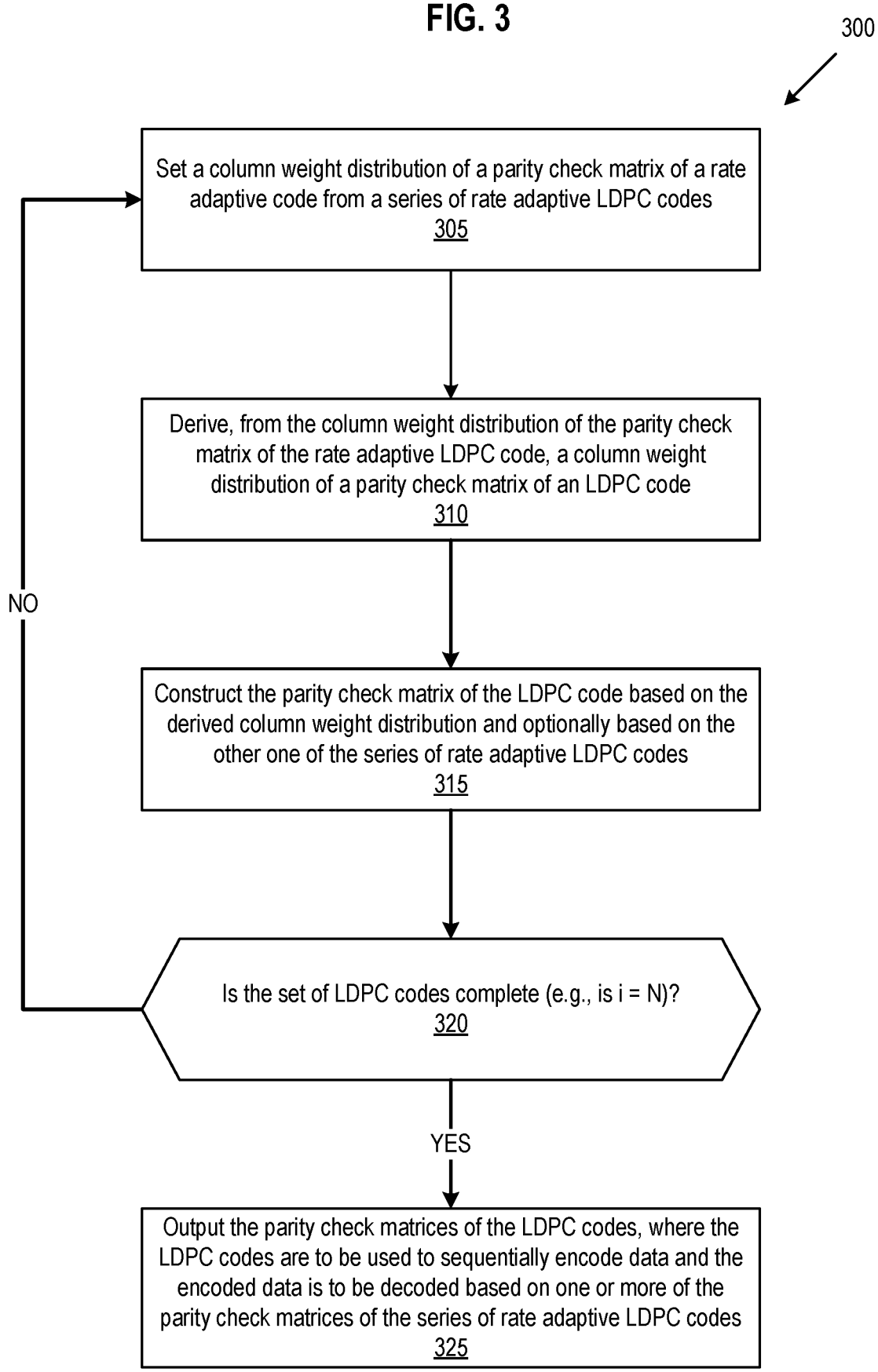
FIG. 3 is a flow diagram of an example method to generate rate adaptive LDPC codes with flexible column weights in the parity check matrices, in accordance with some embodiments of the present disclosure.

FIG. 3 is a flow diagram of an example method to generate rate adaptive LDPC codes with flexible column weights in the parity check matrices, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the code generator 121 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The processing device generates the series of LDPC codes and series of rate adaptive LDPC codes to obtain good correction capabilities. The processing device optimizes the parity check matrices of the LDPC codes. The processing device performs the construction of the encoding matrices sequentially, starting by constructing $H_1$ of the initial LDPC code, then $H_2$ of a subsequent LDPC code, and continues until $H_N$ for the last LDPC code. The parity check matrices of the LDPC codes are constructed based on the matrices of the rate adaptive LDPC code. At each step i, for a matrix $H_i$, and a code $c_i$, the following operations are performed.

At operation 305, the processing device sets a column weight distribution of a decoding parity check matrix $H'_i$ of a code from a series of rate adaptive LDPC codes. The column weight distribution of the matrix is selected according to hardware requirements and/or density evolution. For example, the processing device sets a column weight distribution for the decoding parity check matrix $H'_1$. In another example, the processing device sets a column weight distribution for the decoding parity check matrix $H'_2$. The column weight can correlate to hardware requirements, such as memory size in the encoder and decoder circuits. A greater amount of memory can make the controller circuit expensive to manufacture. As a result, the column weight can be constrained by memory costs. For example, less memory can limit the system to the use of a low column weight. Density evolution refers a method to find the weight distribution that provides the best correction capability. As such, hardware requirements and density evolution help dictate the selection of a weight distribution with good performance that falls within the cost constraints of a system design.

At operation 310, the processing device derives a column weight distribution of an encoding parity check matrix $H_i$ of the LDPC code from the column weight distribution of the decoding parity check matrix $H'_i$ of the rate adaptive LDPC code. In some embodiments, the processing device derives a column weight distribution of an encoding parity check matrix, e.g., $H_1$, as being the column weight distribution of the decoding parity check matrix, e.g., $H'_1$, of the rate adaptive LDPC code. In some embodiments, when a decoding parity check matrix $H'_i$ of the rate adaptive LDPC code includes a vertical concatenation of the encoding parity check matrix $H_i$ and decoding parity check matrix $H'_{i-1}$, the processing device derives the column weight distribution of $H_i$ by subtracting the column weight distribution of $H'_{i-1}$ from the column weight distribution of $H'_i$. For example, the processing device derives the column weight distribution of $H_2$ by subtracting the column weight distribution of $H'_1$ from the column weight distribution of $H'_2$. In a non-limiting example, the column weight distribution of $H'_1$ is set to be 4 for each column of the matrix and the column weight distribution of $H'_2$ is set to 5 for each column of the matrix. It then follows that $H_{2,p}$ has a column weight distribution of 5 for each column of the matrix, since the entries above it in $H'_2$ are all zeros. Meanwhile, the column weight distribution of $H_{2,u}$ is 1 for each column, since the columns above it have a weight of 4 (according to the column weight distribution of $H'_1$).

At operation 315, the processing device constructs the parity check matrix of the LDPC code based on the derived column weight distribution and optionally based on the other one of the series of rate adaptive LDPC codes. In some embodiments, the processing device constructs the encoding matrix $H_i$ while taking into consideration the edges of a graph (e.g., Tanner Graph) associated with the decoding matrix $H'_{i-1}$, since the decoding parity check matrices $H'_1$ of the rate adaptive LDPC codes will be used for the decoding of the codewords encoded with the encoding matrices $H_i$, of the LDPC codes. In some embodiments, the edges of a graph (e.g., Tanner Graph) associated with the decoding matrix $H'_{i-1}$ are also considered when the processing device minimizes trapping sets or other graph structures during the construction of the encoding matrices $H_i$. In some embodiments, the processing device uses an algorithm such as Progressive Edge Growth (PEG) for constructing the matrices.

At operation 320, the processing device determines if the set of LDPC codes is completed (e.g., if the N matrices have been generated for the LDCP codes). When the set of LDPC codes is complete, the flow of operations moves to operation 325. When the set of LDPC codes is not complete, the flow of operations returns to operation 305. The processing device repeats the operations 305-320 until all matrices are generated.

At operation 325, the processing device outputs the encoding parity check matrices of the LDPC codes (e.g., $H_1, \ldots, H_N$). Once the LDPC code matrices are generated, the rate adaptive LDPC decoding matrices can be derived from them by concatenation. The encoding parity check matrices (e.g., $H_1, \ldots, H_N$) of the LDPC codes are used for sequentially encoding data and the encoded data is decoded based on one or more of decoding parity check matrices (e.g., $H'_1, \ldots H'_N$) of the series of rate adaptive codes as described below. The weight of at least one column of the decoding parity check matrix $H'_2$ of the rate adaptive LDPC code is greater than one providing flexibility in the column weight distribution of the matrix (i.e., not limited to weight 1 for each column). The flexibility of weight distribution enables a greater correction capability of the rate adaptive LDPC codes.

Figure 4:
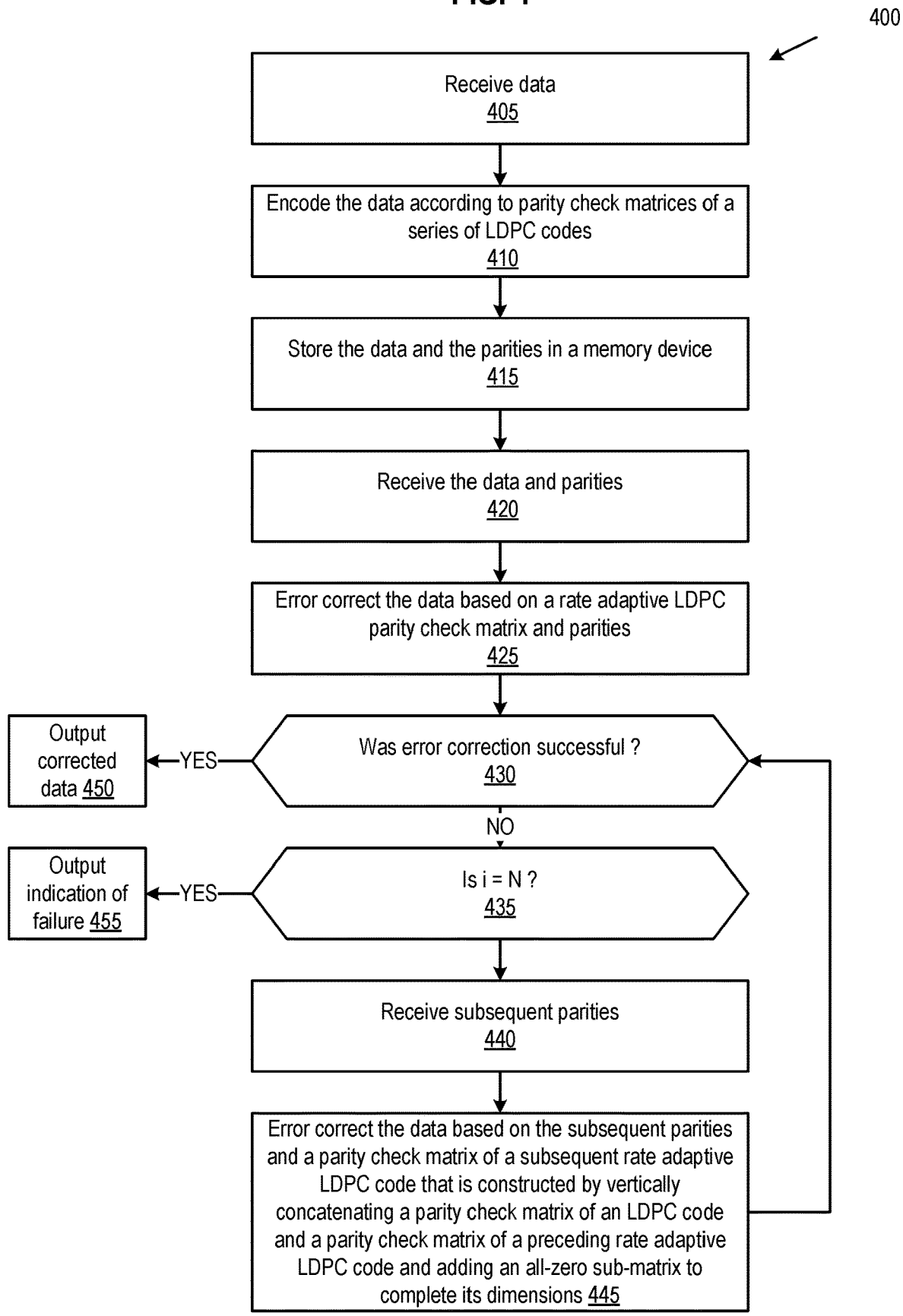
FIG. 4 is a flow diagram of an example method to perform error correction according to a rate adaptive LDPC codes with flexible column weights in the parity check matrices, in accordance with some embodiments of the present disclosure.

FIG. 4 is a flow diagram of an example method to perform error correction according to a rate adaptive LDPC codes with flexible column weights in the parity check matrices, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the error corrector 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing device receives data. The data can be received from a host system 120 as part of a request to write the data into a memory device, e.g., memory device 130.

At operation 410, the processing device encodes the data according to encoding parity check matrices of a series of LDPC codes. The processing device encodes the data sequentially based on the N parity check matrices of the LDPC codes. In one embodiment, each row of the parity-check matrix specifies an equation that the codeword needs to satisfy. The codeword is composed of the user data and the parities. The encoding is performed by finding parity symbols that satisfy the equations specified by the rows of the parity-check matrix, given the user data symbols. There are various ways to solve such a system of linear equations, such as Gaussian elimination. For example, the data is first encoded according to an initial linear code $C_1$, generating a codeword c1. The codeword c1 includes initial parities p1. The codeword c1 is then encoded according to a subsequent linear code $C_2$, generating a subsequent codeword c2 that includes additional parities p2. This sequential encoding continues until the codeword c_N−1 is then encoded according to the linear code $C_N$, generating a subsequent codeword c_N that includes additional parities p_N. At each iteration i in the encoding process, the processing device generates parities $p_i$.

At operation 415, the processing device stores the data and the parities in the memory device. In some embodiments, the data and initial parities (p1) are stored in a section of the memory device (e.g., same page) and the subsequent parities (p2, . . . , p_N) are stored in another section of the memory device (e.g., another page). In some embodiments, the section in which one or more of the subsequent parities (p2, . . . , p_N) is less accessible than the section where the data and initial parities are stored. In some embodiments, each one of the subsequent parities can be stored in different sections of the memory device. For example, subsequent parities can be stored in a different page and a different plane of memory than the initial parities such that initial and subsequent parities can be accessed concurrently.

At operation 420, the processing device receives the data and the initial parities, which form the initial codeword. In some embodiments, the processing device receives the codeword in response to a request to read the data from the memory device 130. The request to read the data is received from the host system 120. For the sake of illustration, the codeword includes one or more bits of data that are in error.

At operation 425, the processing device error corrects the data based on a rate adaptive LDPC decoding parity check matrix. For example, the processing device initially attempts to error correct the received data using decoding matrix $H'_1$, and initial parities p1. Decoding can be performed, e.g., by iteratively making locally optimal estimations of the values of the codeword and syndrome symbols according to the values of the neighbors in a Tanner graph that corresponds to the parity check matrix.

At operation 430, the processing device determines whether the error correction of the codeword based on the initial parities p1 is successful. If the error correction is successful, the flow of operations moves to operation 450, at which the processing device outputs the corrected data in response to the read request. If the error correction is not successful, the flow of operations moves to operation 435.

At operation 435, the processing device determines whether all decoding matrices in the series of matrices of rate adaptive LDPC codes have been used for attempting to correct the data. If all decoding matrices have been used, i.e., i=N, the flow of operations moves to operation 455, at which the processing device outputs an indication of failure of the error correction. In some embodiments, the memory subsystem sends the indication of failure to the host system 120 in response to the read request. Additionally or alternatively, the memory subsystem sends the data to the host system 120 in response to the request. If not all decoding matrices have been used, i.e., i<N, the flow of operations moves to operation 440.

At operation 440, the processing device receives subsequent parities. The subsequent parities were generated for the data based on a matrix of index i+1, e.g., $H_2$, of subsequent LDPC code $c_{i+1}$, e.g., c2. The processing device can transmit a request to the memory device 130 for reading the parities in response to determining that the previous error correction failed (operation 430) and receive the subsequent parities in response to this request.

At operation 445, the processing device error corrects the data based on a decoding parity check matrix, e.g., $H'_2$, of the subsequent rate adaptive LDPC code and parities p2. The parity check matrix of the subsequent rate adaptive LDPC is constructed through a vertical concatenation of the encoding parity check matrix $H_2$ of the subsequent LDPC code and the decoding parity check matrix $H'_1$ of the preceding rate adaptive LDPC code. The decoding parity check matrix $H'_2$ further includes an all-zero sub-matrix to complete its dimensions. The weight of at least one column of the decoding parity check matrix $H'_2$ of the rate adaptive LDPC code is greater than one providing flexibility in the column weight distribution of the matrix (i.e., not limited to weight 1 for each column). The flexibility of weight distribution enables a greater correction capability of the rate adaptive LDPC codes. The error correction of the data is performed as described above using the decoding matrix $H'_2$ and the parities p2. The flow of operations then moves to operation 430. The operations 430-445 are repeated, until the error correction is successful or all matrices of the rate adaptive LDPC codes have been used.

Figure 5:
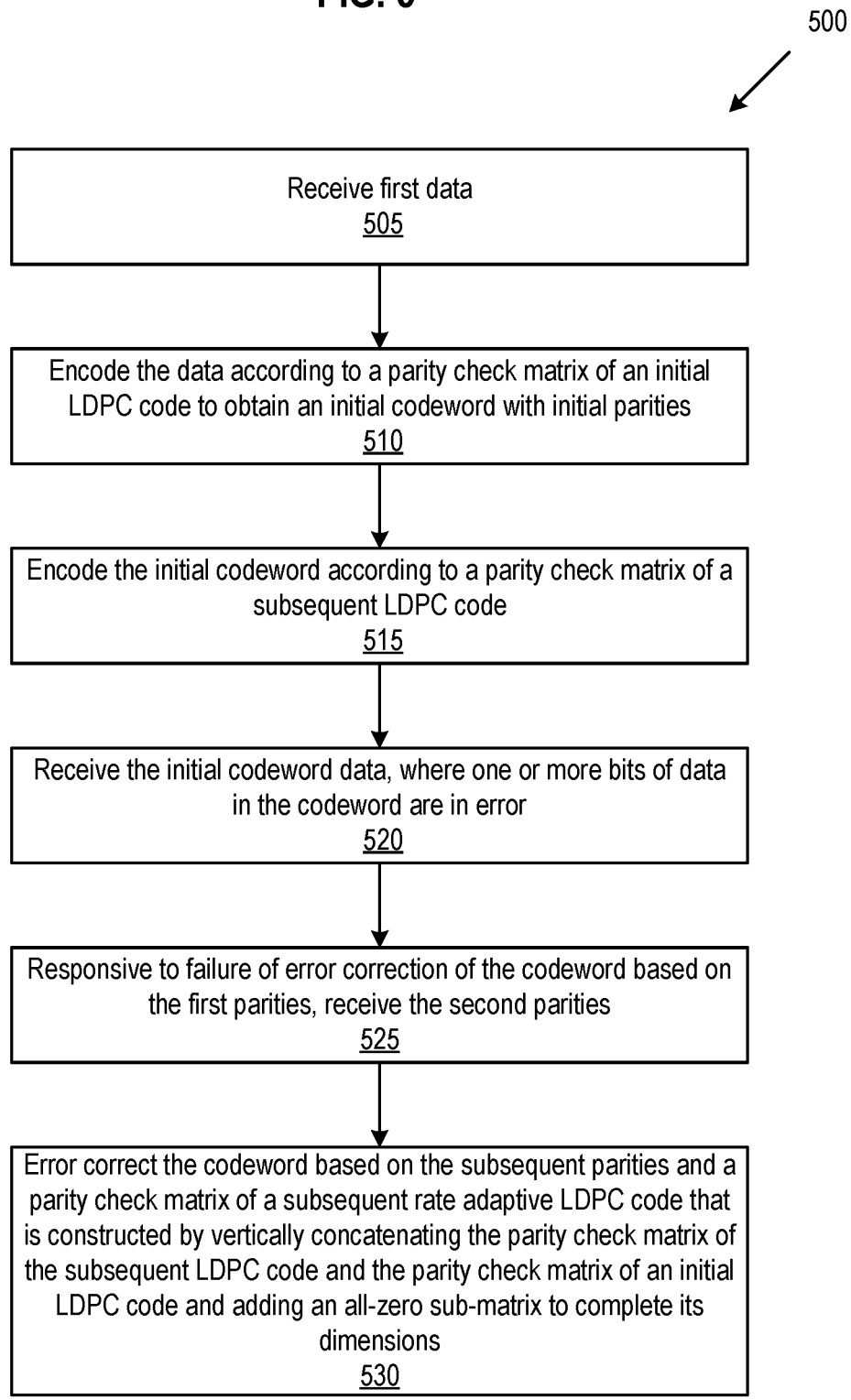
FIG. 5 is a flow diagram of another example method to perform error correction according to a rate adaptive LDPC codes with flexible column weights in the parity check matrices, in accordance with some embodiments of the present disclosure.

FIG. 5 is a flow diagram of another example method 500 to perform error correction according to a rate adaptive LDPC codes with flexible column weights in the parity check matrices, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the error corrector 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, the processing device receives data. The data can be received from a host system 120 as part of a request to write the data into a memory device, e.g., memory device 130.

At operation 510, the processing device encodes the data according to an initial encoding parity check matrix $H_1$ of an initial LDCP code to obtain a codeword c1 with initial parities p1. For example, the processing device encodes the data as described above with reference to operation 410.

At operation 515, the processing device encodes the codeword c1 according to an encoding parity check matrix $H_2$ of a subsequent LDPC code to obtain subsequent parities p2. When the series of LDPC codes includes more than two codes, the sequential encoding of the codewords continues based on the matrices of the subsequent LDPC codes until all parities have been generated for the data.

At operation 520, the processing device receives the initial codeword. For the sake of illustration of error correction, one or more bits of the codeword are in error. In some embodiments, the processing device receives the codeword in response to a request to read the data from the memory device 130. The request to read the data is received from the host system 120.

At operation 525, responsive to failure of error correction of the first codeword based on the first parities, the processing device receives the second parities. In some embodiments, the processing device attempts to correct errors in the codeword based on the initial parities and a decoding parity check matrix $H'_1$ of an initial rate adaptive LDPC code. The processing device determines that the error correction based on this matrix and the initial parities fails. When the error correction fails, the processing device requests subsequent parities, e.g., p2, for the codeword. The subsequent parities p2 were generated for the codeword based on the parity check matrix of the subsequent LDPC code.

At operation 530, the processing device error corrects the codeword based on the subsequent parities and a parity check matrix of a subsequent rate adaptive LDPC code. The decoding matrix $H'_2$ of the subsequent rate adaptive LDPC code is constructed by vertically concatenating the encoding parity check matrix $H_2$ of the subsequent LDPC code and the decoding parity check matrix $H'_1$ of the rate adaptive LDPC code and adding an all-zero sub-matrix to complete the dimensions of the third parity check matrix. In some embodiments, the processing device can continue to receive parities and error corrects the codeword based on these parities and a decoding parity check matrix of an associated rate adaptive LDPC code. The parity check matrix of the subsequent rate adaptive LDPC is constructed through a vertical concatenation of the encoding parity check matrix $H_i$ of the subsequent LDPC code and the decoding parity check matrix $H'_{i-1}$ of the preceding rate adaptive LDPC code. The weight of at least one column of the rate adaptive parity check matrix is greater than one.

Figure 6:
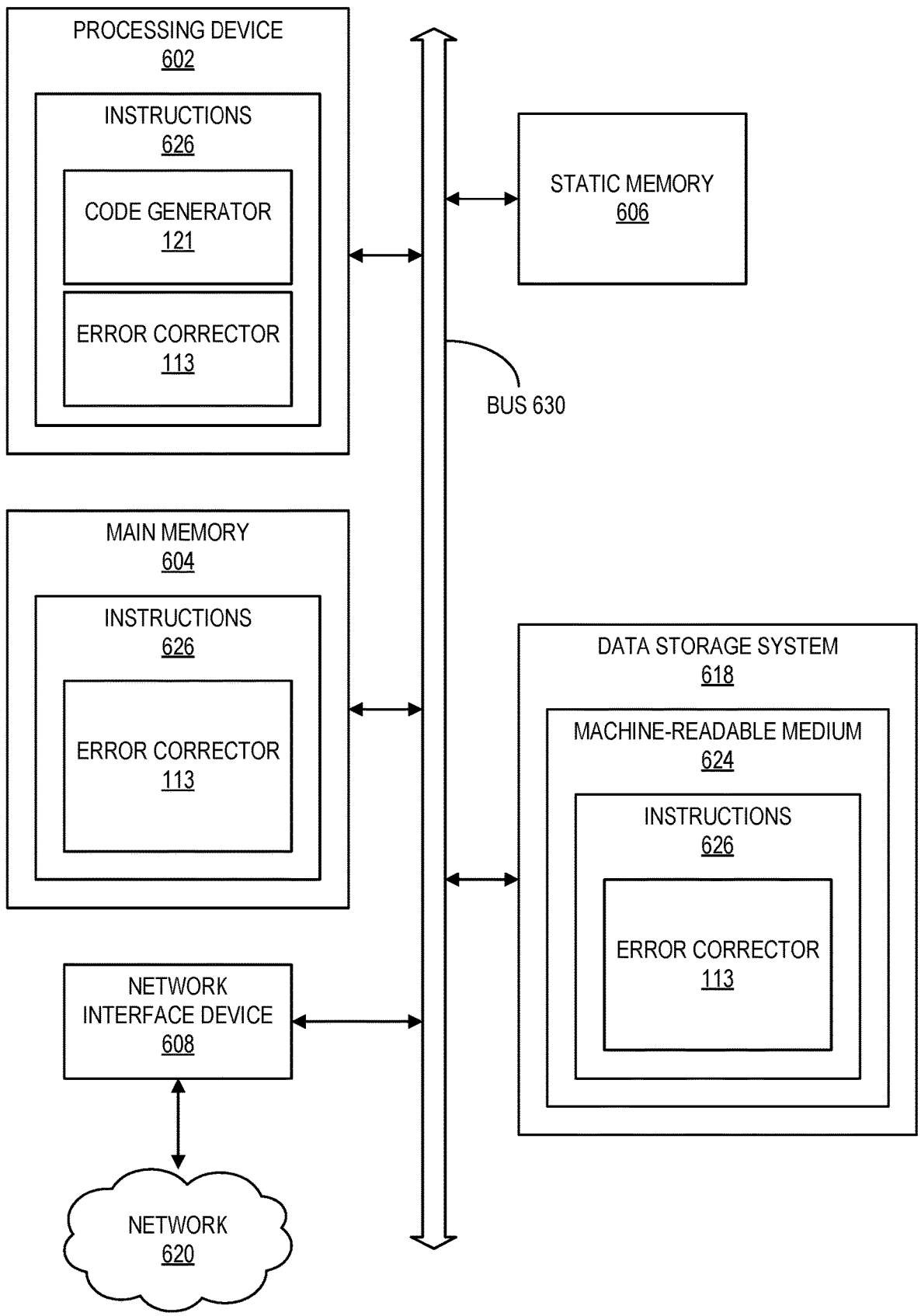
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the error corrector 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory subsystem 110 of FIG. 1.

In one embodiment, the instructions 626 include instructions to implement functionality corresponding to an error corrector (e.g., the error corrector 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 400, 500, and 600 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
receiving first data;
encoding the first data according to a first encoding parity check matrix of a first Low Density Parity Check (LDPC) code to obtain a first codeword with first parities;
encoding the first codeword according to a second encoding parity check matrix of a second LDPC code to obtain second parities;
receiving the first codeword, wherein one or more bits of data in the first codeword are in error;
responsive to failure of error correction of the first codeword based on the first parities, receiving the second parities; and
error correcting the first codeword based on the second parities and a decoding parity check matrix of a rate adaptive LDPC code that is constructed by vertically concatenating the second encoding parity check matrix and the first encoding parity check matrix and adding an all-zero sub-matrix to complete the dimensions of the decoding parity check matrix.

2. The method of claim 1, further comprising:
storing the first codeword in a first section of a memory device; and
storing the second parities in a second section of the memory device that is different from the first section.

3. The method of claim 2, wherein the second section of the memory device is less accessible than the first section.

4. The method of claim 1, wherein the receiving the first codeword is in response to a request from a host system to read the first data from a memory device.

5. The method of claim 1, wherein the first encoding parity check matrix and the second encoding parity check matrix are systematic matrices, wherein a systematic matrix includes a first sub-matrix for determining parities and a second sub-matrix for data to be encoded.

6. The method of claim 1, wherein a weight of at least one column of the decoding parity check matrix is greater than one.

7. A non-transitory computer-readable storage medium comprising instructions that, when executed by a processing device, cause the processing device to:
receive first data;
encode the first data according to a first encoding parity check matrix of a first Low Density Parity Check (LDPC) code to obtain a first codeword with first parities;
encode the first codeword according to a second encoding parity check matrix of a second LDPC code to obtain second parities;
receive the first codeword, wherein one or more bits of data in the first codeword are in error;
responsive to failure of error correction of the first codeword based on the first parities, receive the second parities; and
error correct the first codeword based on the second parities and a decoding parity check matrix of a rate adaptive LDPC code that is constructed by vertically concatenating the second encoding parity check matrix and the first encoding parity check matrix and adding an all-zero sub-matrix to complete the dimensions of the decoding parity check matrix.

8. The non-transitory computer-readable storage medium of claim 7, wherein the processing device is further to:
store the first codeword in a first section of a memory device; and
store the second parities in a second section of the memory device that is different from the first section.

9. The non-transitory computer-readable storage medium of claim 8, wherein the second section of the memory device is less accessible than the first section.

10. The non-transitory computer-readable storage medium of claim 7, wherein to receive the first codeword is in response to a request from a host system to read the first data from a memory device.

11. The non-transitory computer-readable storage medium of claim 7, wherein the first encoding parity check matrix and the second encoding parity check matrix are systematic matrices, wherein a systematic matrix includes a first sub-matrix for determining parities and a second sub-matrix for data to be encoded.

12. The non-transitory computer-readable storage medium of claim 7, wherein a weight of at least one column of the third parity check matrix is greater than one.

13. A system comprising:
a plurality of memory devices; and
a processing device, operatively coupled with the plurality of memory devices, to:
receive first data,
encode the first data according to a first encoding parity check matrix of a first Low Density Parity Check (LDPC) code to obtain a first codeword with first parities,
encode the first codeword according to a second encoding parity check matrix of a second LDPC code to obtain second parities,
receive the first codeword, wherein one or more bits data in of the first codeword are in error,
responsive to failure of error correction of the first codeword based on the first parities, receive the second parities, and
error correct the first codeword based on the second parities and a decoding parity check matrix of a rate adaptive LDPC code that is constructed by vertically concatenating the encoding second parity check matrix and the first encoding parity check matrix and adding an all-zero sub-matrix to complete the dimensions of the decoding parity check matrix.

14. The system of claim 13, wherein the processing device is further to:
store the first codeword in a first section of a memory device; and
store the second parities in a second section of the memory device that is different from the first section.

15. The system of claim 14, wherein the second section of the memory device is less accessible than the first section.

16. The system of claim 13, wherein to receive the first codeword is in response to a request from a host system to read the first data from a memory device.

17. The system of claim 13, wherein the first encoding parity check matrix and the second encoding parity check matrix are systematic matrices, wherein a systematic matrix includes a first sub-matrix for determining parities and a second sub-matrix for data to be encoded.

18. The system of claim 13, wherein a weight of at least one column of the decoding parity check matrix is greater than one.

\* \* \* \* \*